United States Patent
Tanaka et al.

(10) Patent No.: US 11,387,796 B2
(45) Date of Patent: Jul. 12, 2022

(54) POWER AMPLIFIER CIRCUIT

(71) Applicant: Murata Manufacturing Co., Ltd., Kyoto (JP)

(72) Inventors: Satoshi Tanaka, Kyoto (JP); Kazuo Watanabe, Kyoto (JP); Norio Hayashi, Kyoto (JP); Makoto Itou, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 36 days.

(21) Appl. No.: 16/709,262

(22) Filed: Dec. 10, 2019

(65) Prior Publication Data

US 2020/0195210 A1   Jun. 18, 2020

(30) Foreign Application Priority Data

Dec. 13, 2018 (JP) .............................. JP2018-233484

(51) Int. Cl.
*H03F 3/24* (2006.01)
*H03F 3/19* (2006.01)
*H03F 1/30* (2006.01)
*H03F 1/02* (2006.01)

(52) U.S. Cl.
CPC ............ *H03F 3/245* (2013.01); *H03F 1/0205* (2013.01); *H03F 1/302* (2013.01); *H03F 3/19* (2013.01)

(58) Field of Classification Search
CPC ........ H03F 3/245; H03F 1/0205; H03F 1/302; H03F 3/19
USPC .......................................................... 330/295
See application file for complete search history.

(56) References Cited

U.S. PATENT DOCUMENTS

| | | | | |
|---|---|---|---|---|
| 6,137,367 A * | 10/2000 | Ezzedine | ................ | H03F 1/223 330/311 |
| 6,515,547 B2 * | 2/2003 | Sowlati | .................. | H03F 1/223 330/311 |
| 10,122,325 B2 * | 11/2018 | Benson | ..................... | H03F 1/18 |
| 10,135,395 B2 | 11/2018 | Tanaka et al. | | |
| 2003/0011436 A1 * | 1/2003 | Shigematsu | ............ | H03F 3/607 330/311 |
| 2018/0248530 A1 * | 8/2018 | Katsumata | .............. | H03F 3/245 |
| 2019/0326857 A1 | 10/2019 | Tanaka et al. | | |

FOREIGN PATENT DOCUMENTS

| | | |
|---|---|---|
| JP | 2018-85689 A | 5/2018 |
| WO | 2013/129431 A1 | 9/2013 |

* cited by examiner

*Primary Examiner* — Hafizur Rahman
(74) *Attorney, Agent, or Firm* — Pearne & Gordon LLP (57) ABSTRACT

A power amplifier circuit includes a lower-stage transistor having a first power supply voltage supplied to a first terminal, a second terminal connected to ground, and a first signal supplied to a third terminal; an upper-stage transistor having a second power supply voltage supplied to a first terminal, a second signal obtained by amplifying the first signal being output from the first terminal, a second terminal connected to the first terminal of the lower-stage transistor via a first capacitor, and a third terminal connected to ground via a ground path; an inductor that connects the second terminal of the upper-stage transistor to ground; and an adjustment circuit that adjusts impedance seen from the third terminal of the upper-stage transistor. The adjustment circuit includes a second capacitor and at least one resistance element connected in series with the ground path between the third terminal of the upper-stage transistor and ground.

10 Claims, 10 Drawing Sheets

POWER AMPLIFIER CIRCUIT

This application claims priority from Japanese Patent Application No. 2018-233484 filed on Dec. 13, 2018. The content of this application is incorporated herein by reference in its entirety.

BACKGROUND

The present disclosure relates to a power amplifier circuit. Mobile communication devices such as mobile phones include a power amplifier circuit that amplifies the power of a signal using transistors. For example, Japanese Unexamined Patent Application Publication No. 2018-85689 discloses a power amplifier circuit including two vertically connected transistors. In the disclosed power amplifier circuit, the emitter of the upper-stage transistor is connected to the collector of the lower-stage transistor via a capacitor and is also connected to ground via an inductor, thereby rendering the upper- and lower-stage transistors conductive for alternating current (AC) and cut-off for direct current (DC). Accordingly, a signal having a voltage amplitude that is approximately twice as high as a power supply voltage is output from the collector of the upper-stage transistor, and consequently the power amplifier circuit provides larger maximum output power than a power amplifier circuit that amplifies power using a single transistor.

However, in the configuration disclosed in Japanese Unexamined Patent Application Publication No. 2018-85689, due to the effect of the parasitic capacitance of the upper-stage transistor, the capacitor connected between the upper- and lower-stage transistors, or the like, the upper-stage transistor may be less stable and might oscillate in certain condition.

BRIEF SUMMARY

The present disclosure provides a power amplifier circuit that provides large maximum output power while providing improved stability.

According to embodiments of the present disclosure, a power amplifier circuit includes a lower-stage transistor having a first terminal, a second terminal, and a third terminal, wherein a first power supply voltage is supplied to the first terminal, the second terminal is connected to ground, and a first signal is supplied to the third terminal; a first capacitor; an upper-stage transistor having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the first capacitor, and the third terminal is connected to ground via a ground path; an inductor that connects the second terminal of the upper-stage transistor to ground; and an adjustment circuit that adjusts impedance seen from the third terminal of the upper-stage transistor. The adjustment circuit includes a second capacitor and at least one resistance element, which are connected in series with the ground path between the third terminal of the upper-stage transistor and ground.

According to embodiments of the present disclosure, a power amplifier circuit includes a lower-stage transistor having a first terminal, a second terminal, and a third terminal, wherein a first power supply voltage is supplied to the first terminal, the second terminal is connected to ground, and a first signal is supplied to the third terminal; a first capacitor; an upper-stage transistor having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the first capacitor, and a bias current or bias voltage is supplied to the third terminal from a bias circuit via a bias supply path; an inductor that connects the second terminal of the upper-stage transistor to ground; and an adjustment circuit that adjusts impedance seen from the third terminal of the upper-stage transistor. The adjustment circuit includes a second capacitor and at least one resistance element, which are connected in series with the bias supply path between the third terminal of the upper-stage transistor and an output end of the bias circuit.

According to embodiments of the present disclosure, it may be possible to provide a power amplifier circuit that provides large maximum output power while providing improved stability.

Other features, elements, characteristics and advantages of the present disclosure will become more apparent from the following detailed description of embodiments of the present disclosure with reference to the attached drawings.

DETAILED DESCRIPTION

The following describes an embodiment of the present disclosure in detail with reference to the drawings. The same or substantially the same elements are denoted by the same numeral, and will not be repeatedly described.

Figure 1:
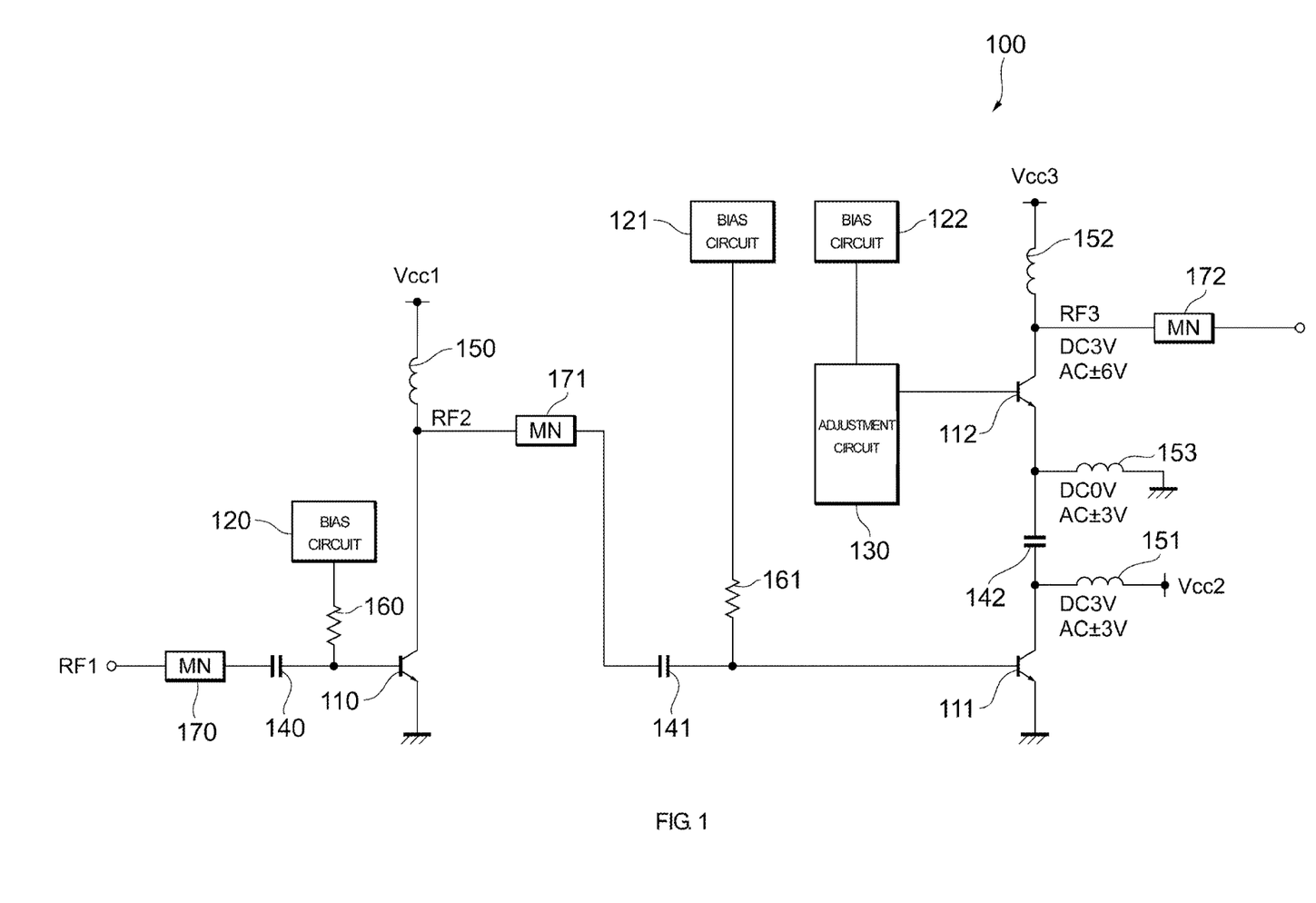
FIG. 1 illustrates an example configuration of a power amplifier circuit according to an embodiment of the present disclosure.

FIG. 1 illustrates an example configuration of a power amplifier circuit 100 according to an embodiment of the present disclosure. The power amplifier circuit 100 is mounted in, for example, a mobile communication device such as a mobile phone and is used to amplify the power of a radio-frequency (RF) signal to be transmitted to a base station. For example, the power amplifier circuit 100 amplifies transmission signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. The RF signal has a frequency of about several hundreds of megahertz (MHz) to about several tens of gigahertz (GHz), for example. The power amplifier circuit 100 may amplify signals having other frequencies and conforming to other communication standards.

As illustrated in FIG. 1, the power amplifier circuit 100 includes transistors 110 to 112, bias circuits 120 to 122, an adjustment circuit 130, capacitors 140 to 142, inductors 150 to 153, resistance elements 160 and 161, and matching networks (MNs) 170 to 172.

The power amplifier circuit 100 includes two-stage amplifiers. The first-stage (drive-stage) amplifier includes the transistor 110, and the second-stage (power-stage) amplifier includes the transistor 111 and the transistor 112. The drive-stage amplifier amplifies an RF signal RF1 and outputs an RF signal RF2. The power-stage amplifier amplifies the RF signal RF2 and outputs an RF signal RF3. In this way, the power amplifier circuit 100 amplifies the power of a transmission signal in two stages.

In this embodiment, each of the transistors 110 to 112 is constituted by a bipolar transistor such as a heterojunction bipolar transistor (HBT). Each of these transistors may be constituted by a field-effect transistor such as a metal-oxide-semiconductor field-effect transistor (MOSFET) instead of by an HBT. In this case, the terms "collector", "base", and "emitter" in the following description are changed to the terms "drain", "gate", and "source", respectively.

In the drive-stage amplifier, the collector of the transistor 110 is supplied with a power supply voltage Vcc1 via the inductor 150, the emitter of the transistor 110 is connected to ground, and the base of the transistor 110 is supplied with the RF signal RF1 via the matching network 170 and the capacitor 140. The base of the transistor 110 is further supplied with a bias current or bias voltage from the bias circuit 120 via the resistance element 160. As a result, the RF signal RF2, which is obtained by amplifying the RF signal RF1, is output from the collector of the transistor 110.

In the power-stage amplifier, the transistor 111 and the transistor 112 synchronously perform similar amplification operations. The collector (first terminal) of the lower-stage transistor 111 (lower-stage transistor) is supplied with a power supply voltage Vcc2 (first power supply voltage) via the inductor 151, the emitter (second terminal) of the lower-stage transistor 111 is connected to ground, and the base (third terminal) of the lower-stage transistor 111 is supplied with the RF signal RF2 (first signal) via the capacitor 141. The base of the transistor 111 is further supplied with a bias current or bias voltage (second bias current or bias voltage) from the bias circuit 121 via the resistance element 161.

The collector (first terminal) of the upper-stage transistor 112 (upper-stage transistor) is supplied with a power supply voltage Vcc3 (second power supply voltage) via the inductor 152, the emitter (second terminal) of the upper-stage transistor 112 is connected to ground via the inductor 153, and the base (third terminal) of the upper-stage transistor 112 is supplied with a bias current or bias voltage (first bias current or bias voltage) from the bias circuit 122 via the adjustment circuit 130. The emitter of the transistor 112 is connected to the collector of the lower-stage transistor 111 via the capacitor 142. Accordingly, the upper-stage transistor 112 outputs the RF signal RF3 (second signal), which is obtained by amplifying the RF signal RF2, from the collector of the upper-stage transistor 112. The operation of the power-stage amplifier will be described in detail below.

The capacitor 142 (first capacitor) has an end connected to the emitter of the upper-stage transistor 112 and another end connected to the collector of the lower-stage transistor 111. The capacitor 142 has a function of isolating the upper-stage transistor 112 and the lower-stage transistor 111 from each other for DC and connecting the upper-stage transistor 112 and the lower-stage transistor 111 to each other for AC.

The inductor 153 has an end connected to the emitter of the upper-stage transistor 112 and another end connected to ground. The inductor 153 has a function of connecting the emitter of the upper-stage transistor 112 to ground for DC.

The bias circuits 120, 121 (second bias circuit), and 122 (first bias circuit) generate the respective bias currents or bias voltages and supply the bias currents or bias voltages to the bases of the transistors 110, 111, and 112, respectively. The bias circuits 120 to 122 respectively adjust the bias currents or bias voltages to control bias conditions for the transistors 110 to 112.

The adjustment circuit 130 is provided between the bias circuit 122 and the base of the upper-stage transistor 112 and adjusts the impedance seen from the base of the transistor 112. A specific configuration of the adjustment circuit 130 will be described below.

The capacitors 140 and 141 are provided on the input side of the transistors 110 and 111, respectively. Each of the capacitors 140 and 141 blocks the DC component included in the RF signal and allows the AC component included in the RF signal to pass therethrough.

The inductor 150 has an end to which the power supply voltage Vcc1 is supplied, and another end connected to the collector of the transistor 110. The inductor 151 has an end to which the power supply voltage Vcc2 is supplied, and another end connected to the collector of the transistor 111. The inductor 152 has an end to which the power supply voltage Vcc3 is supplied, and another end connected to the collector of the transistor 112. The inductors 150 to 152 prevent the RF signal from leaking toward a power supply circuit (not illustrated).

The resistance element 160 is provided between an output end of the bias circuit 120 and the base of the transistor 110. The resistance element 161 is provided between an output end of the bias circuit 121 and the base of the transistor 111. The resistance elements 160 and 161 are provided to adjust the bias currents or bias voltages supplied from the bias circuits 120 and 121, respectively, or to prevent an increase in the temperature of the transistors 110 and 111, which is caused by an excessive amount of current flow. While a similar resistance element may be provided between an output end of the bias circuit 122 and the base of the transistor 112, such a resistance element is included in the adjustment circuit 130 and will be described below.

The matching networks 170 to 172 match the impedances of the preceding components and the subsequent components. The matching network 170 matches the impedances of the preceding circuit (not illustrated) of the matching network 170 and the transistor 110. The matching network 171 matches the impedances of the transistor 110 and the transistor 111. The matching network 172 matches the impedances of the transistor 112 and the circuit (not illustrated) subsequent to the matching network 172. Each of the matching networks 170 to 172 is constituted by, for example, a capacitor and an inductor. The power amplifier circuit 100 may not include some or any of the matching networks 170 to 172 if any other component has some or all of the functions of the matching networks 170 to 172.

Next, the operation of the power-stage amplifier will be described in detail. In the following description, both the power supply voltage Vcc2 and the power supply voltage Vcc3 are assumed to be 3 V.

The power supply voltage Vcc2 (DC 3 V) is supplied to the collector of the lower-stage transistor 111 for DC, and thus the collector voltage of the lower-stage transistor 111 changes in a range of DC 3 V±AC 3 V. The emitter voltage of the upper-stage transistor 112 changes in a range of DC 0 V±AC 3 V since the emitter of the upper-stage transistor 112 is connected to ground for DC and is connected to the collector of the lower-stage transistor 111 for AC. The collector voltage of the upper-stage transistor 112 changes in a range of DC 3 V±AC 6 V since the power supply voltage Vcc3 (DC 3 V) is supplied to the collector of the upper-stage transistor 112 for DC and the signal amplitudes at the collector and the emitter of the transistor 112 are added together for AC. Accordingly, the signal amplitude across the collector and emitter of the upper-stage transistor 112 is equal to the signal amplitude across the collector and emitter of the lower-stage transistor 111, whereas the signal amplitude at the collector of the upper-stage transistor 112 is approximately twice as high as the signal amplitude across the collector and emitter of the upper-stage transistor 112.

Given that the output power of a signal is denoted by P, the collector voltage by V, and the load impedance of an amplifier by R, a relationship given by $P=V^2/R$ holds. That is, to double the voltage amplitude and double the output power, the load impedance is doubled. In the power amplifier circuit 100, accordingly, the load impedance is doubled without necessarily increasing the power supply voltages Vcc2 and Vcc3. As a result, the maximum output power of the signal is increased.

Next, the configuration and function of the adjustment circuit 130 will be described in detail.

Figure 2:
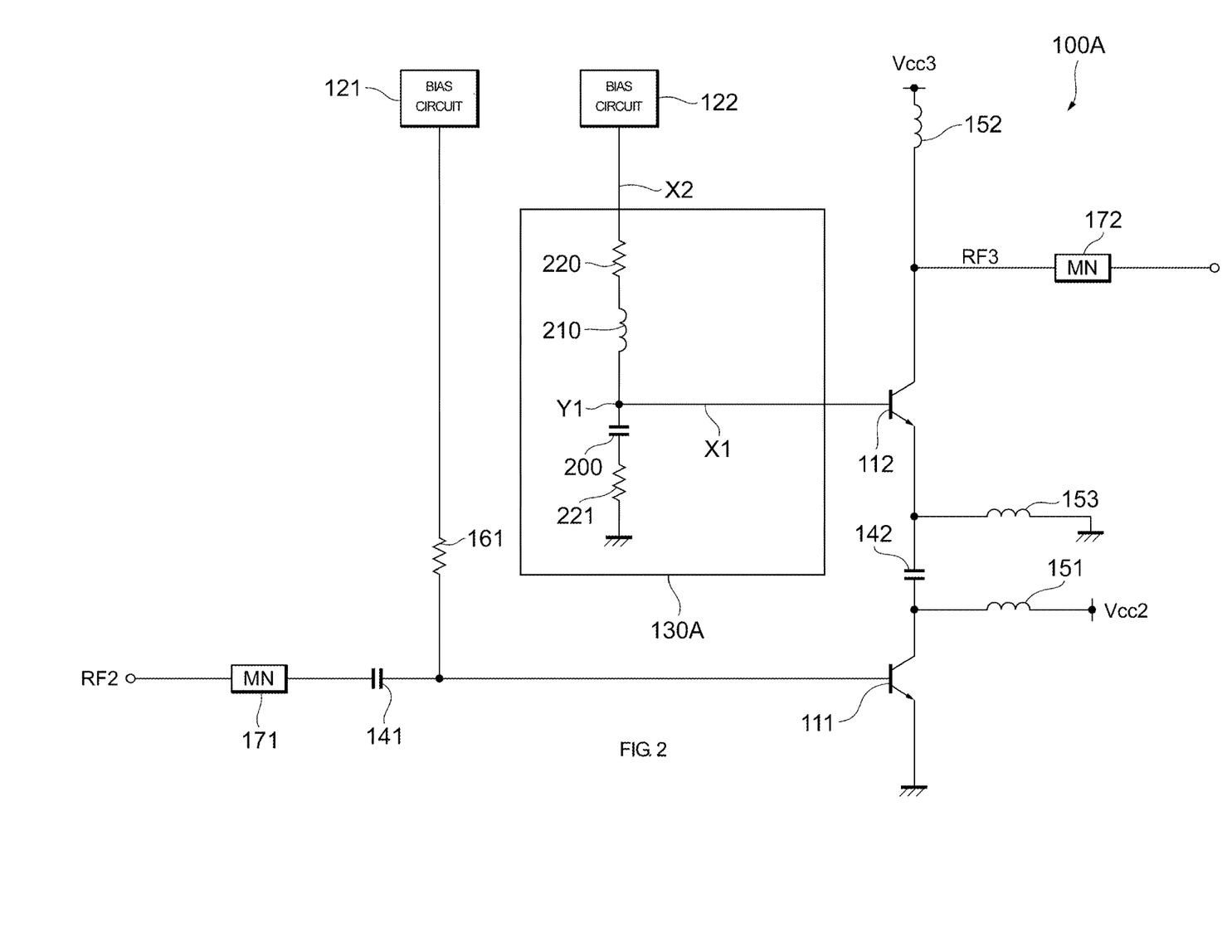
FIG. 2 illustrates an example configuration of the power amplifier circuit, in which an adjustment circuit illustrated in FIG. 1 is specifically illustrated.

FIG. 2 illustrates an example configuration of a power amplifier circuit 100A, in which the adjustment circuit illustrated in FIG. 1 is specifically illustrated. In FIGS. 2 and 4 to 10 described below, the components related to the drive stage are not illustrated, and the components related to the power stage are illustrated, for convenience of illustration.

As illustrated in FIG. 2, in the power amplifier circuit 100A, the base of the upper-stage transistor 112 is connected to ground via a ground path X1. The bias circuit 122 supplies a bias current or bias voltage to a supply point (node) Y1 on the ground path X1 via a bias supply path X2.

An adjustment circuit 130A includes a capacitor 200, an inductor 210, and resistance elements 220 and 221.

The resistance element 220 (first resistance element) and the inductor 210 are connected in series with the bias supply path X2 between the output end of the bias circuit 122 and the supply point Y1. Like the resistance elements 160 and 161 illustrated in FIG. 1, the resistance element 220 is also provided to adjust the bias current or bias voltage output from the bias circuit 122 or to prevent an increase in the temperature of the transistor 112. The inductor 210 is provided to match the impedance seen from the base of the transistor 112.

The capacitor 200 (second capacitor) and the resistance element 221 are connected in series with the ground path X1 between the supply point Y1 and ground. The capacitor 200 is provided to change the base voltage of the transistor 112 with the amplitude of the signal amplified by the transistor 112 and to match the impedance seen from the base of the transistor 112. The capacitance value of the capacitor 200 can be smaller than the capacitance value of the capacitor 142, for example. This is because if the capacitor 200 has an excessively large capacitance value, a change in the base voltage of the transistor 112 is suppressed. The resistance element 221 has predetermined impedance and is provided to intentionally consume the energy of the signal.

With the configuration described above, the adjustment circuit 130A has the following two functions. The first function of the adjustment circuit 130A is to prevent, by using the capacitor 200, the amplitude operation of the base voltage of the transistor 112 from being restricted by the output end of the bias circuit 122. That is, to turn on the upper-stage transistor 112, the base-emitter voltage of the transistor 112 needs to be greater than or equal a predetermined voltage. In other words, the base voltage of the transistor 112 needs to change as the emitter voltage of the transistor 112 changes. The adjustment circuit 130A, which includes, for example, the capacitor 200, has a function of changing the base voltage of the transistor 112 with the signal amplitude.

The second function of the adjustment circuit 130A is to adjust the impedance seen from the base of the transistor 112 to improve the stability of the transistor 112 and to suppress oscillation. The stability of a transistor will be described with reference to FIGS. 3A and 3B.

Figure 3A:
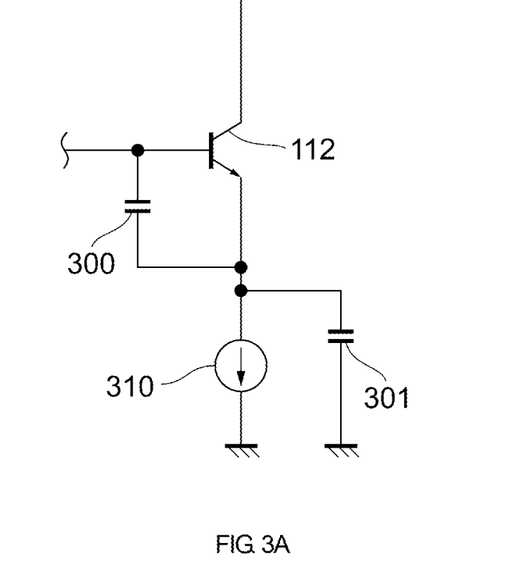
FIG. 3A illustrates in a simplified manner a power-stage amplifier illustrated in FIG. 2.

FIG. 3A illustrates in a simplified manner the power-stage amplifier illustrated in FIG. 2. A parasitic capacitor 300 represents the parasitic capacitance between the base and emitter of the upper-stage transistor 112. A capacitor 301 represents capacitance connected to the emitter of the upper-stage transistor 112. The capacitance connected to the emitter of the transistor 112 includes, for example, the capacitor 142 illustrated in FIG. 2, the parasitic capacitance between the base and collector of the lower-stage transistor 111, the parasitic capacitance between the base and emitter of the transistor 111, and the like. For convenience of illustration, the lower-stage transistor 111 is indicated by a current source 310.

Figure 3B:
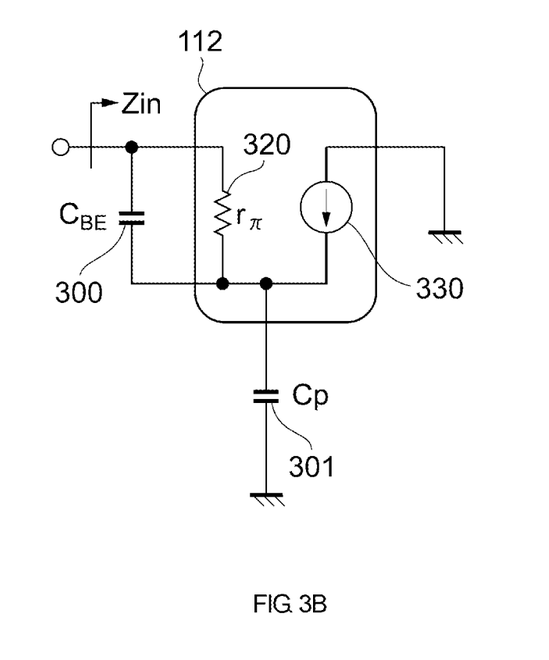
FIG. 3B illustrates an equivalent circuit of a transistor illustrated in FIG. 3A.

FIG. 3B illustrates an equivalent circuit of the transistor illustrated in FIG. 3A. In FIG. 3B, the upper-stage transistor 112 is indicated by a current source 330 and a resistance element 320 representing input impedance. It is assumed that the capacitance value of the parasitic capacitor 300 is denoted by $C_{BE}$, the capacitance value of the capacitor 301 by $C_P$, the input impedance of the transistor 112 by $r\pi$, the transconductance by $g_m$, and the angular frequency of the signal input to the transistor 112 by $\omega$. The real part Re(Zin) of input impedance Zin seen from the base of the transistor 112 is given by Equation (1) below.

$$\text{Re}(Zin) = \frac{\omega^2 C_P \left( \dfrac{C_P}{r_\pi} - g_m C_{BE} \right)}{\left( g_m + \dfrac{1}{r_\pi} \right)^2 + \omega^2 (C_{BE} + C_P)^2} \quad (1)$$

Equation (1) indicates that the real part Re(Zin) of the input impedance Zin becomes negative depending on the condition of the transistor. In this case, a negative resistance is generated, which may impair the stability of the transistor 112. As a result, oscillation may occur. To address this, a load whose impedance has a positive real part is intentionally inserted in the adjustment circuit 130A according to this embodiment to cancel the negative resistance. Specifically, the resistance element 221 connected in series with the capacitor 200 is included in the adjustment circuit 130A. Thus, the negative resistance that appears in the input impedance Zin (i.e., in FIG. 2, the impedance on the transistor 112 side seen from the output end of the bias circuit 122) is canceled, and the stability of the transistor 112 is improved. The resistance value of the resistance element 221 is not limited to any specific value, and can be a resistance value that makes the real part of the input impedance Zin be 0 or more, for example.

With the configuration described above, the power amplifier circuit 100A can provide larger maximum output power than a configuration in which power is amplified using a single transistor, while providing improved stability.

In the adjustment circuit 130A, the resistance element 220 and the inductor 210 are connected in series in this order from the bias circuit 122 to the supply point Y1, and the capacitor 200 and the resistance element 221 are connected in series in this order from the supply point Y1 to ground, by way of example but not limitation. The order of the series-connected elements may be reversed. This also applies to the following modifications. In addition, depending on the input impedance Zin, the adjustment circuit 130A may not include one of the resistance element 220, the inductor 210, the capacitor 200, and the resistance element 221.

The power amplifier circuit 100A is configured such that two transistors are vertically connected in the power-stage amplifier. Alternatively, three or more transistors may be vertically connected.

The power amplifier circuit 100A includes two-stage amplifiers. However, the number of stages of amplifiers is not limited to two, and one or three or more stages of amplifiers may be used. In a power amplifier circuit including three or more stages of amplifiers, the configuration of the power-stage amplifier illustrated in FIG. 2 may be applied to any of the amplifiers.

Figure 4:
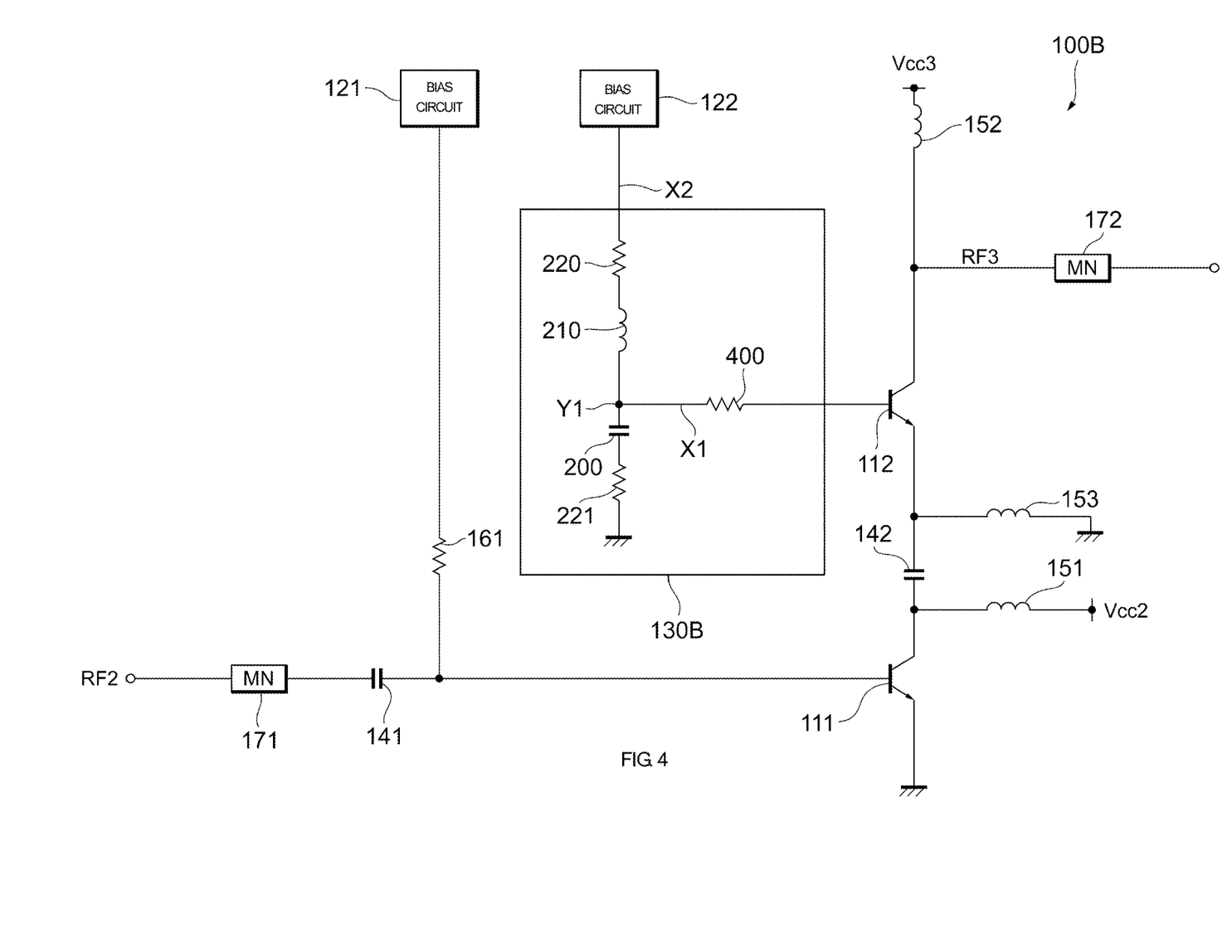
FIG. 4 illustrates an example configuration of a power amplifier circuit including a first modification of the adjustment circuit illustrated in FIG. 2.

FIG. 4 illustrates an example configuration of a power amplifier circuit 100B including a first modification of the adjustment circuit illustrated in FIG. 2. In this modification and the following modifications, features common to the embodiment described above will not be described, and only the differences will be described. In particular, similar operational effects achieved with similar configurations will not be described again in the individual modifications.

As illustrated in FIG. 4, in the power amplifier circuit 100B, unlike the power amplifier circuit 100A, an adjustment circuit 130B further includes a resistance element 400.

The resistance element 400 (second resistance element) is connected in series with the ground path X1 between the base of the upper-stage transistor 112 and the supply point Y1. In other words, the resistance element 400 is connected in series with the resistance element 221 (third resistance element). Accordingly, the resistance element 400 has both a function of adjusting the bias current or bias voltage, like the resistance element 220, and a function of a load that consumes energy, like the resistance element 221.

With the configuration described above, the power amplifier circuit 100B can also achieve advantages similar to those of the power amplifier circuit 100A. The adjustment circuit 130B is capable of separately adjusting the respective constants of the capacitor 200, the resistance element 221, and the resistance element 400, and is thus more flexible in design that the adjustment circuit 130A. In the adjustment circuit 130B, furthermore, the load on the ground path X1 is divided into the resistance element 221 and the resistance element 400, and thus the resistance value of each resistance element can be smaller than that in the adjustment circuit 130A. The ground path X1 is defined as a path whose initial point (node) is the base of the transistor 112 and whose end point is a point (node) connected to the capacitor 200 or the inductor 210.

The adjustment circuit 130A may not include the inductor 210, for example. When the adjustment circuit 130A does not include the inductor 210, the resistance element 220 also functions as a load that consumes energy, in addition to the capacitor 200, the resistance element 221, and the resistance element 400. If the resistance value of the resistance element 220 is large to some extent, the resistance element 220 has small consumption of energy. By setting the respective constants of the capacitor 200 and the resistance elements 221 and 400, as appropriate, appropriate consumption can be obtained.

Figure 5:
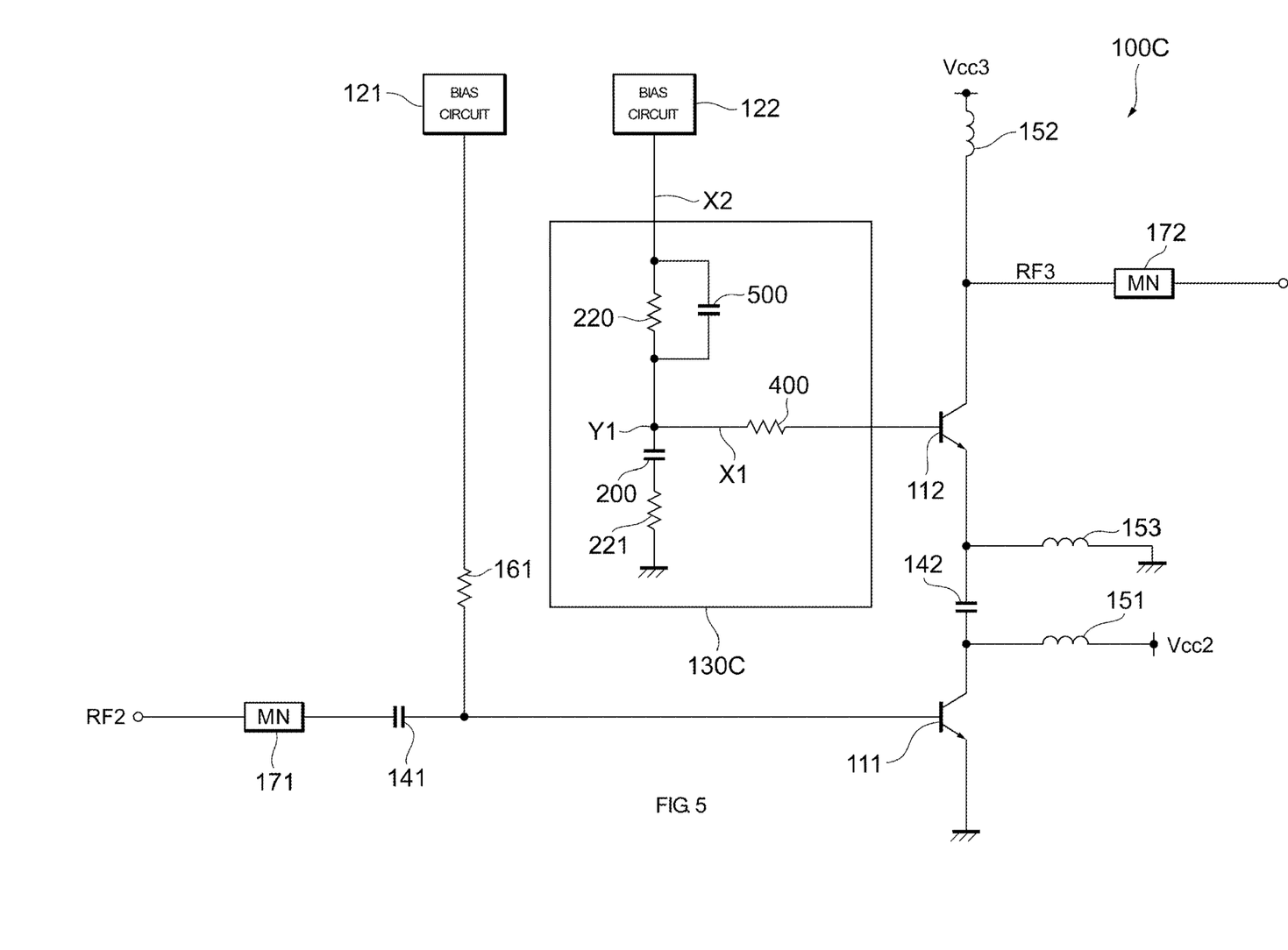
FIG. 5 illustrates an example configuration of a power amplifier circuit including a second modification of the adjustment circuit illustrated in FIG. 2.

FIG. 5 illustrates an example configuration of a power amplifier circuit 100C including a second modification of the adjustment circuit illustrated in FIG. 2. As illustrated in FIG. 5, in the power amplifier circuit 100C, unlike the power amplifier circuit 100B, an adjustment circuit 130C includes a capacitor 500 in place of the inductor 210.

The capacitor 500 (third capacitor) has an end connected to the output end of the bias circuit 122 and another end connected to the supply point Y1 so that the capacitor 500 is connected in parallel with the resistance element 220. The capacitance value of the capacitor 500 can be smaller than the capacitance value of the capacitor 142, for example. In the adjustment circuit 130C, in addition to the capacitor 200, the capacitor 500 also contributes to the adjustment of the impedance seen from the base of the transistor 112.

With the configuration described above, the power amplifier circuit 100C can also achieve advantages similar to those of the power amplifier circuits 100A and 100B. Like the adjustment circuits 130A and 130B, the adjustment circuit 130C may include an inductor corresponding to the inductor 210.

Figure 6:
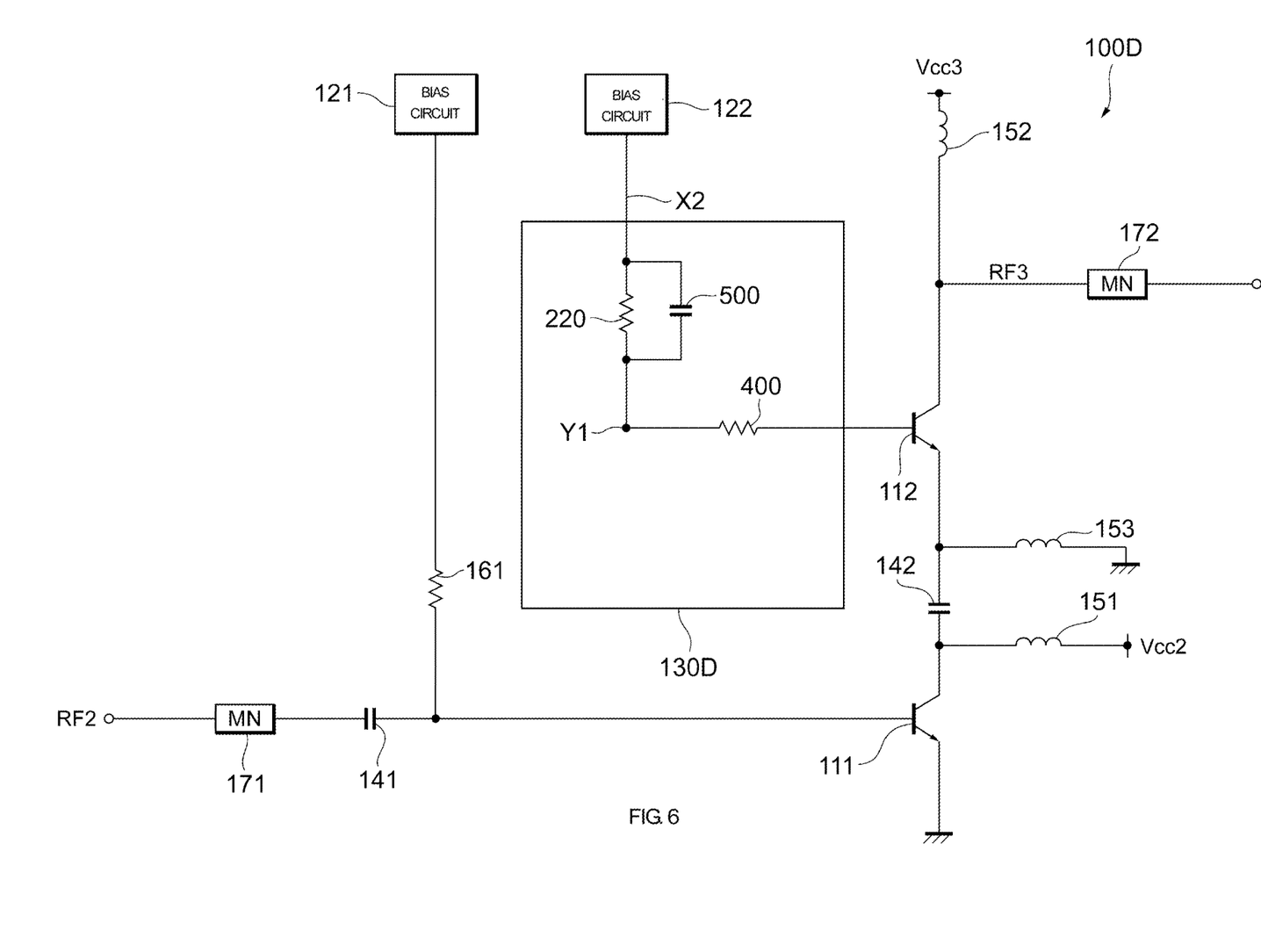
FIG. 6 illustrates an example configuration of a power amplifier circuit including a third modification of the adjustment circuit illustrated in FIG. 2.

FIG. 6 illustrates an example configuration of a power amplifier circuit 100D including a third modification of the adjustment circuit illustrated in FIG. 2. As illustrated in FIG. 6, in the power amplifier circuit 100D, unlike the power amplifier circuit 100C, the base of the upper-stage transistor 112 is not connected to ground, and an adjustment circuit 130D does not include the capacitor 200 or the resistance element 221.

As described previously, like the capacitor 200 illustrated in FIG. 5, the capacitor 500 enables the AC component to be grounded in a state close to the ideal. The resistance element 400 has a function similar to that of the resistance element 221 illustrated in FIG. 5.

Thus, the adjustment circuit 130D can achieve advantages similar to those of the adjustment circuits 130A to 130C without necessarily including the capacitor 200 and the resistance element 221 illustrated in FIG. 5.

With the configuration described above, the power amplifier circuit 100D can also achieve advantages similar to those of the power amplifier circuits 100A to 100C. Like the adjustment circuits 130A and 130B, the adjustment circuit 130D may include an inductor corresponding to the inductor 210.

Figure 7:
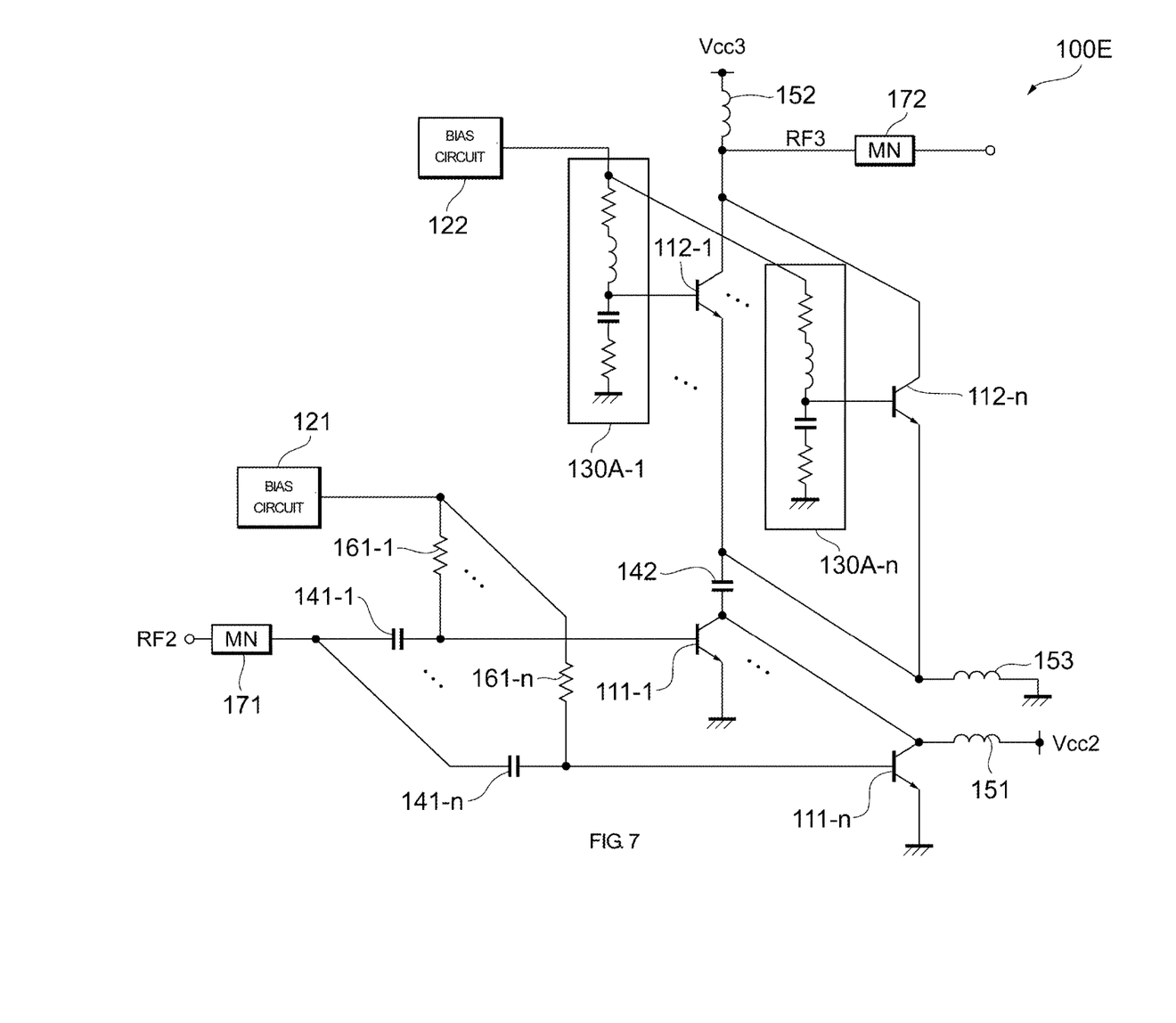
FIG. 7 illustrates an example configuration of a power amplifier circuit in which each of upper- and lower-stage transistors illustrated in FIG. 2 includes a plurality of unit transistors.

FIG. 7 illustrates an example configuration of a power amplifier circuit 100E in which each of the upper- and lower-stage transistors illustrated in FIG. 2 includes a plurality of unit transistors.

Specifically, the power amplifier circuit 100E includes n (n is an integer greater than or equal to 2) unit transistors 111-1 to 111-$n$ and 112-1 to 112-$n$, n adjustment circuits 130A-1 to 130A-n, n capacitors 141-1 to 141-$n$, and n resistance elements 161-1 to 161-$n$ in place of the transistors 111 and 112, the adjustment circuit 130A, the capacitor 141, and the resistance element 161 of the power amplifier circuit 100A. The circuit configuration of each of the n adjustment circuits 130A-1 to 130A-n is similar to that of the adjustment circuit 130A described above and will not be described in detail.

The n unit transistors 111-1 to 111-$n$ and the n unit transistors 112-1 to 112-$n$ are each a minimum element that functions as a transistor. These unit transistors are connected in parallel with each other to operate as a single transistor as a whole. In the power amplifier circuit 100E, for example, in the lower stage, the unit transistor 111-1, the capacitor 141-1, and the resistance element 161-1 are formed into a single unit. In the upper stage, the unit transistor 112-1 and the adjustment circuit 130A-1 are formed into a single unit. The formed n units are connected in parallel with each other.

Since the power amplifier circuit 100E includes an adjustment circuit for each unit transistor, the constants of the elements included in the adjustment circuits 130A-1 to 130A-n can be set in accordance with the condition of each unit transistor. Thus, for example, it is possible to reduce deterioration of stability caused by the parasitic capacitance of wiring or the like.

In the power amplifier circuit 100E illustrated in FIG. 7, the configuration of the adjustment circuit 130A is applied as an example of an adjustment circuit. However, the configuration of an adjustment circuit is not limited to this, and the configuration of any of the other adjustment circuits 130B to 130D may be applied. This also applies to FIGS. 8 to 10 described below.

Next, a specific example of a bias circuit that supplies bias currents or bias voltages to the upper- and lower-stage transistors will be described.

Figure 8:
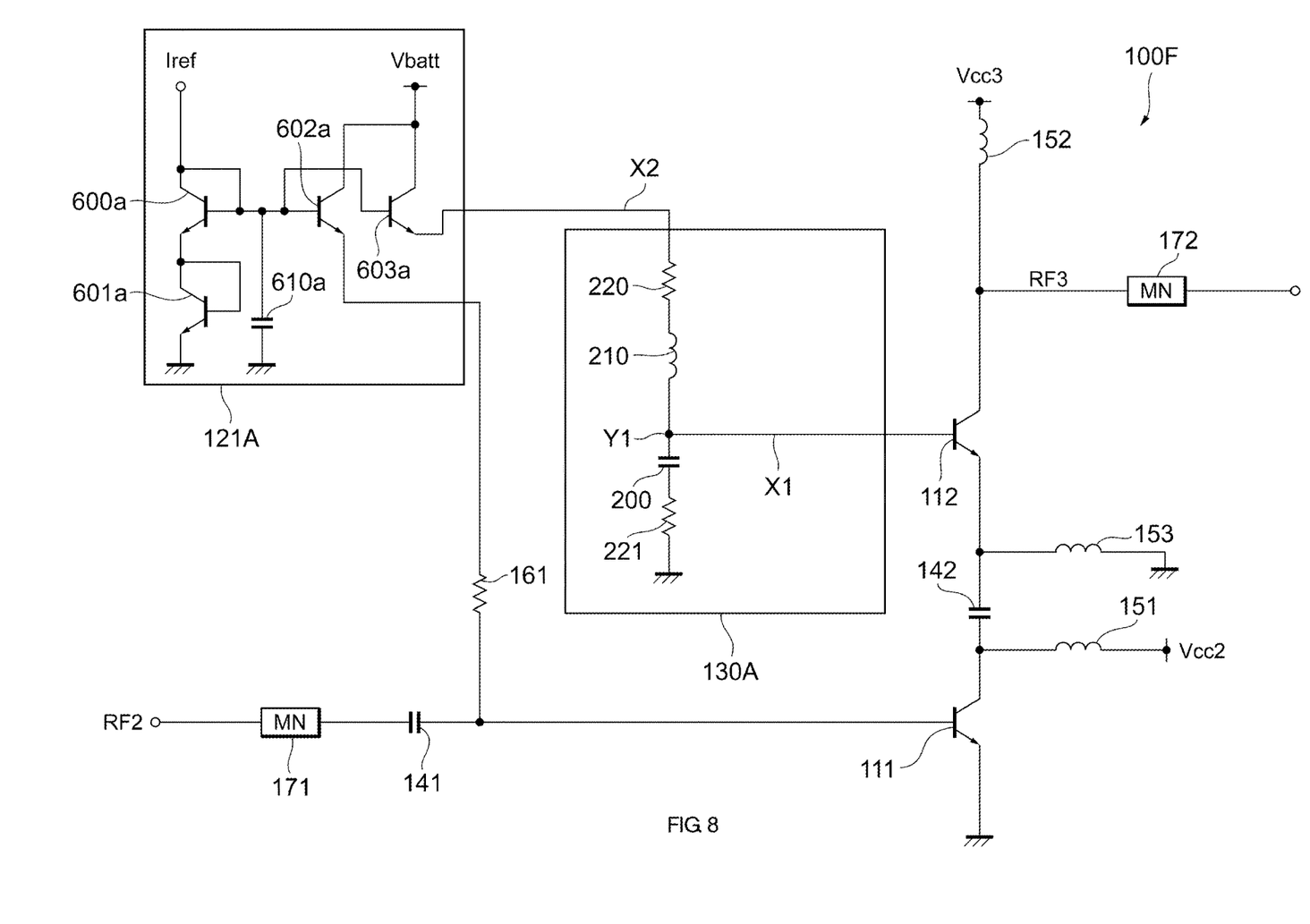
FIG. 8 illustrates an example configuration of a power amplifier circuit, in which bias circuits illustrated in FIG. 2 are specifically illustrated.

FIG. 8 illustrates an example configuration of a power amplifier circuit 100F, in which bias circuits illustrated in FIG. 2 are specifically illustrated. As illustrated in FIG. 8, unlike the power amplifier circuit 100A, the power amplifier circuit 100F includes a single bias circuit 121A in place of the two bias circuits 121 and 122.

In the power amplifier circuit 100F, the single bias circuit 121A functions as a bias circuit of the upper-stage transistor and a bias circuit of the lower-stage transistor. The bias circuit 121A includes, for example, transistors 600$a$ to 603$a$ and a capacitor 610$a$.

The collector and base of the transistor 600$a$ are connected to each other (hereinafter referred to as diode-connected). A control current Iref is supplied to the collector of the transistor 600$a$, and the emitter of the transistor 600$a$ is connected to the collector of the transistor 601$a$. The transistor 601$a$ is diode-connected, and the emitter of the transistor 601$a$ is connected to ground. Accordingly, a voltage having a predetermined level (for example, about 2.6 V) is generated at the collector of the transistor 600$a$. The diode-connected transistors 600$a$ and 601$a$ may be replaced by diodes.

The capacitor 610$a$ has an end connected to the bases of the transistor 602$a$ and the transistor 603$a$ and another end connected to ground. The capacitor 610$a$ suppresses changes in the base voltages of the transistor 602$a$ and the transistor 603$a$.

The transistor 602$a$ and the transistor 603$a$ are connected in parallel to each other. The collector of the transistor 602$a$ is supplied with a battery voltage Vbatt, the base of the transistor 602$a$ is connected to the collector of the transistor 600$a$, and the emitter of the transistor 602$a$ is connected to an end of the resistance element 161. The collector of the transistor 603$a$ is supplied with the battery voltage Vbatt, the base of the transistor 603$a$ is connected to the collector of the transistor 600$a$, and the emitter of the transistor 603$a$ is connected to an end of the resistance element 220. Accordingly, bias currents each corresponding to the control current Iref are output from the emitters of the transistor 602$a$ and the transistor 603$a$. In this embodiment, the bias circuit 121A is controlled by the control current Iref, by way of example. The bias circuit may be controlled by a control voltage in place of a control current.

In the power amplifier circuit 100F, bias currents can be supplied to both the lower-stage transistor 111 and the upper-stage transistor 112 by using the single bias circuit 121A. Thus, it is possible to achieve a smaller circuit size than that in a configuration in which a bias circuit is provided for each transistor.

Figure 9:
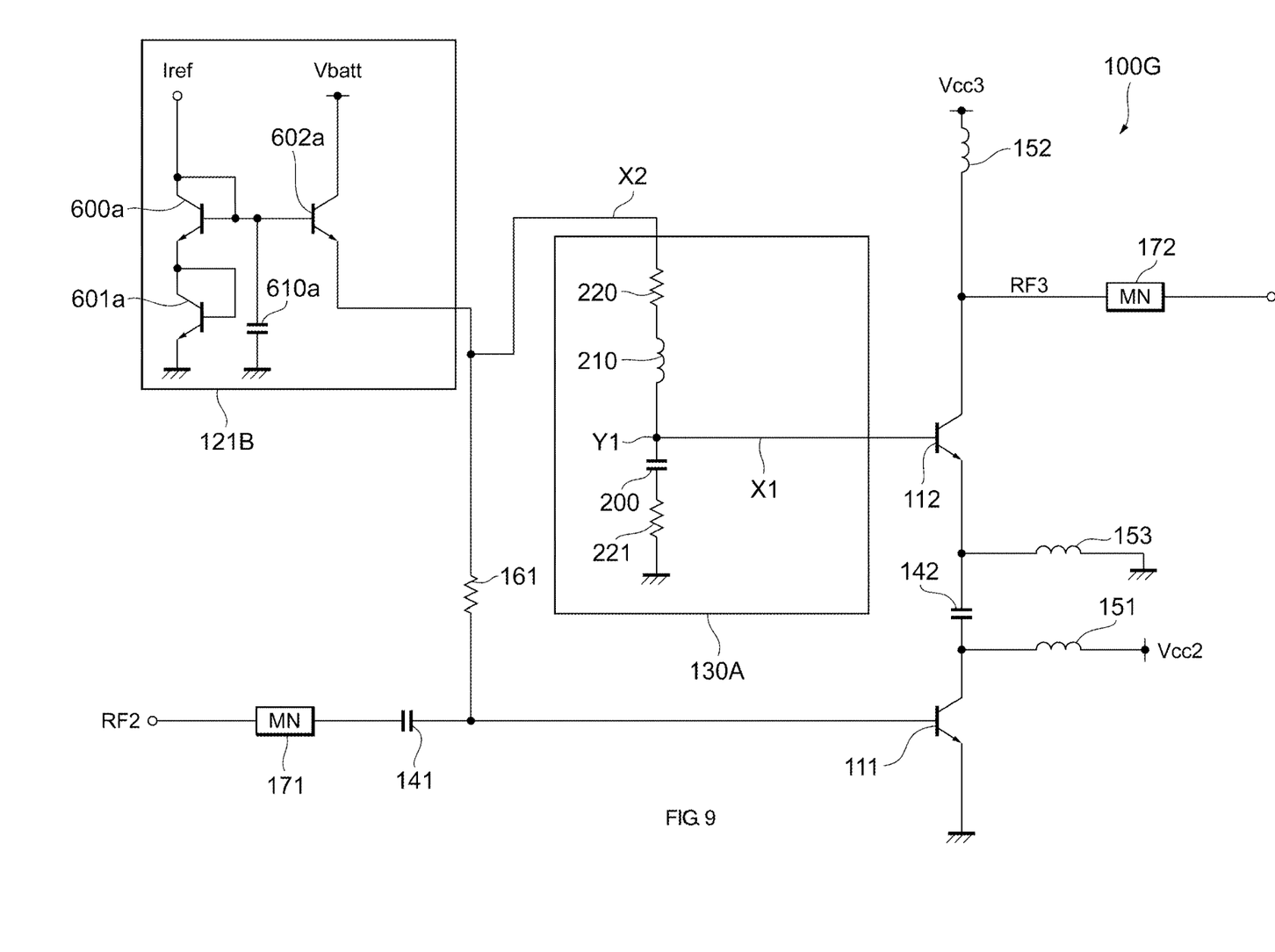
FIG. 9 illustrates an example configuration of a power amplifier circuit including a first modification of the bias circuit illustrated in FIG. 8.

FIG. 9 illustrates an example configuration of a power amplifier circuit 100G including a first modification of the bias circuit illustrated in FIG. 8. As illustrated in FIG. 9, unlike the power amplifier circuit 100F, the power amplifier circuit 100G includes a bias circuit 121B in place of the bias circuit 121A.

Unlike the bias circuit 121A, the bias circuit 121B does not include the transistor 603$a$. In the bias circuit 121B, a bias current output from the emitter of the transistor 602$a$ is divided and supplied to both the transistor 111 and the transistor 112.

With the configuration described above, the power amplifier circuit 100G can also achieve advantages similar to those of the power amplifier circuit 100F.

Figure 10:
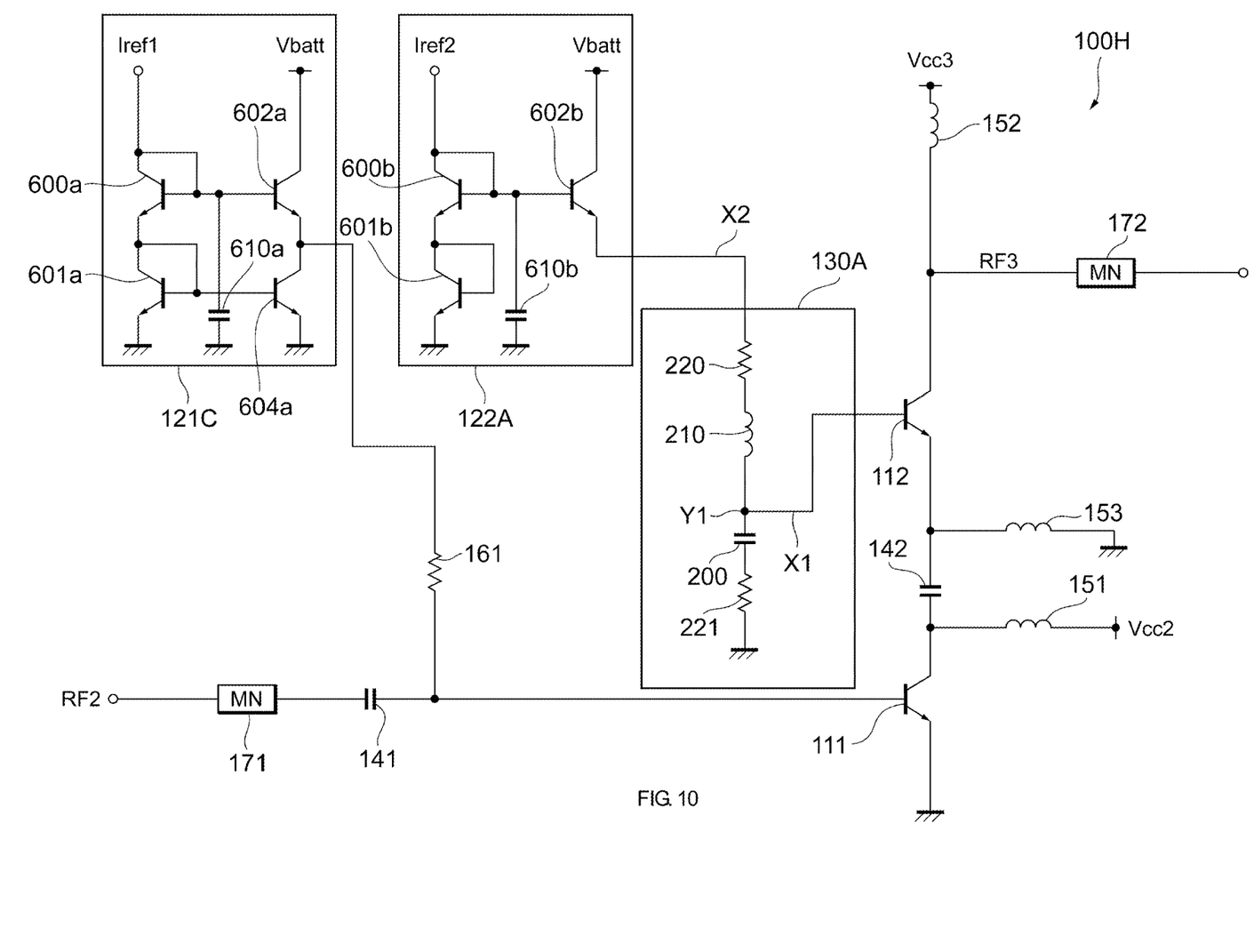
FIG. 10 illustrates an example configuration of a power amplifier circuit including a second modification of the bias circuit illustrated in FIG. 8.

FIG. 10 illustrates an example configuration of a power amplifier circuit 100H including a second modification of the bias circuit illustrated in FIG. 8. As illustrated in FIG. 10, the power amplifier circuit 100H includes bias circuits 121C and 122A as a specific example of the bias circuits 121 and 122 in the power amplifier circuit 100A.

Unlike the bias circuit 121B illustrated in FIG. 9, the bias circuit 121C (second bias circuit) further includes a transistor 604$a$. The collector of the transistor 604$a$ is connected to the emitter of the transistor 602$a$, the base of the transistor 604$a$ is connected to the base of the transistor 601$a$, and the emitter of the transistor 604$a$ is connected to ground. The transistor 604$a$ functions to extract current from the transistor 602$a$ to stably supply a bias current from the transistor 602$a$ to the transistor 111.

The bias circuit 122A (first bias circuit) includes, for example, transistors 600$b$ to 602$b$ and a capacitor 610$b$. The specific configuration of the bias circuit 122A is similar to that of the bias circuit 121B and will not be described in detail. The operation of the bias circuit 121C is controlled by a control current Iref1, and the operation of the bias circuit 122A is controlled by a control current Iref2.

In the power amplifier circuit 100H, since a bias circuit is provided for each of the upper- and lower-stage transistors, it is possible to provide a suitable bias current to each transistor. In addition, the bias circuit 121C and the bias circuit 122A have different configurations and are controlled by the different control currents Iref1 and Iref2, respectively.

Accordingly, the bias circuits 121C and 122A can control a bias current to be supplied to the lower-stage transistor 111 and a bias current to be supplied to the upper-stage transistor 112 to have different characteristics. Thus, the following advantages are achieved.

In the power amplifier circuit 100H, the adjustment circuit 130A is connected to the upper-stage transistor 112, and impedance is adjusted by the adjustment circuit 130A. This may cause an imbalance between the lower-stage transistor 111 and the upper-stage transistor 112, which are to synchronously operate, depending on the impedance of the adjustment circuit 130A. In this embodiment, bias currents having different characteristics are supplied to the lower-stage transistor 111 and the upper-stage transistor 112, thereby making the bias conditions for these transistors different. For example, the power amplifier circuit 100H is configured such that in at least one region of the output power in the power-stage amplifier, the bias circuit 121C supplies a larger amount of bias current than the bias circuit 122A. Accordingly, the imbalance between the lower-stage transistor 111 and the upper-stage transistor 112 can be compensated for, and the characteristics of the power-stage amplifier are improved.

The method for making the bias conditions for the lower-stage transistor 111 and the upper-stage transistor 112 different is not limited to that described above. For example, the bias circuit 121C may supply a bias current to the upper-stage transistor 112, and the bias circuit 122A may supply a bias current to the lower-stage transistor 111. Alternatively, both bias circuits may have the same configuration, and generate bias currents having different characteristics in accordance with control currents or control voltages.

As illustrated in FIGS. 8 and 9, when a bias circuit is shared by the lower-stage transistor 111 and the upper-stage transistor 112, for example, the resistance element 161 and the resistance element 220 may have different resistance values to make the bias conditions different.

Further, in the power amplifier circuit 100 illustrated in FIG. 1, the configuration of any of the bias circuits 121A to 121C and 122A may be applied to the bias circuit 120 that operates the drive-stage transistor 110.

An exemplary embodiment of the present disclosure has been described. The power amplifier circuits 100, 100A to 100C, and 100E to 100H include the lower-stage transistor 111 having a first terminal, a second terminal, and a third terminal, wherein a first power supply voltage is supplied to the first terminal, the second terminal is connected to ground, and a first signal is supplied to the third terminal; the capacitor 142; the upper-stage transistor 112 having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor 111 via the capacitor 142, and the third terminal is connected to ground via a ground path; the inductor 153 that connects the second terminal of the upper-stage transistor 112 to ground; and the adjustment circuits 130 and 130A to 130C that adjust impedance seen from the third terminal of the upper-stage transistor 112. The adjustment circuits 130 and 130A to 130C include the capacitor 200 and at least one resistance element 221, which are connected in series with the ground path between the third terminal of the upper-stage transistor 112 and ground. With this configuration, the resistance element 221 cancels the negative resistance of input impedance in the upper-stage transistor 112. Thus, it is possible to provide large maximum output power while providing improved stability.

In the power amplifier circuits 100, 100A to 100C, and 100E to 100H, the ground path X1 has the supply point Y1 to which a bias current or bias voltage is supplied from the bias circuits 122, 121A, 121B, and 122A via the bias supply path X2; and the adjustment circuits 130 and 130A to 130C further include the resistance element 220 connected in series with the bias supply path X2 between the bias circuits 122, 121A, 121B, and 122A and the supply point Y1. With this configuration, it is possible to adjust the bias current or bias voltage to be supplied to the upper-stage transistor 112 and to reduce the increase in the temperature of the upper-stage transistor 112.

In the power amplifier circuits 100B and 100C, the at least one resistance element includes the resistance element 400 and the resistance element 221, the resistance element 400 is provided between the base of the upper-stage transistor 112 and the supply point Y1, and the resistance element 221 is provided between the supply point Y1 and ground. With this configuration, a load on the ground path X1 is divided into the resistance element 221 and the resistance element 400, and, for example, the resistance value of each resistance element can be smaller than that in the adjustment circuit 130A.

In the power amplifier circuit 100C, the adjustment circuit 130C further includes the capacitor 500 connected in parallel with the resistance element 220. With this configuration, like the capacitor 200, the capacitor 500 also has a function of adjusting impedance, and is thus flexible in design.

The power amplifier circuit 100H includes the bias circuit 122A that supplies a bias current or bias voltage to the base of the upper-stage transistor 112, and the bias circuit 121C that supplies a bias current or bias voltage to the base of the lower-stage transistor 111. The bias circuit 122A and the bias circuit 121C have different configurations, and the bias currents or bias voltages that are output therefrom also have different characteristics. With this configuration, the bias conditions for the upper- and lower-stage transistors can be made different. Accordingly, the imbalance between the upper- and lower-stage transistors is compensated for, and the characteristics of the power-stage amplifier are improved.

The power amplifier circuit 100D includes the lower-stage transistor 111 having a first terminal, a second terminal, and a third terminal, wherein a first power supply voltage is supplied to the first terminal, the second terminal is connected to ground, and a first signal is supplied to the third terminal; the capacitor 142; the upper-stage transistor 112 having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the capacitor 142, and a bias current or bias voltage is supplied to the third terminal from the bias circuit 122 via the bias supply path X2; the inductor 153 that connects the second terminal of the upper-stage transistor 112 to ground; and the adjustment circuit 130D that adjusts impedance seen from the third terminal of the upper-stage transistor 112. The adjustment circuit 130D includes the capacitor 500 and at least one resistance element 400, which are connected in series with the bias supply path X2 between the third terminal of the upper-stage transistor 112 and the output end of the bias circuit 122. By setting the respective constants of the capacitor 500 and the resistance element 400 as appropriate, it is possible to achieve advantages similar to those of the adjustment circuits 130A to 130C.

The embodiment described above is intended to help easily understand the present disclosure, and is not to be used to construe the present disclosure in a limiting fashion. Various modifications or improvements can be made to the present disclosure without necessarily departing from the gist of the present disclosure, and equivalents thereof are also included in the present disclosure. That is, the embodiment may be appropriately modified in design by those skilled in the art, and such modifications also fall within the scope of the present disclosure so long as the modifications include the features of the present disclosure. For example, the elements included in the embodiment and the arrangement, materials, conditions, shapes, sizes, and the like thereof are not limited to those described in the illustrated examples, but can be modified as appropriate. Furthermore, the elements included in the embodiment can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a lower-stage transistor having a first terminal, a second terminal, and a third terminal, wherein a first power supply voltage is supplied to the first terminal, the second terminal is connected to ground, and a first signal is supplied to the third terminal;
    a first capacitor;
    an upper-stage transistor having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the first capacitor, and the third terminal is connected to ground via a ground path;
    an inductor that connects the second terminal of the upper-stage transistor to ground;
    a first bias circuit configured to supply a first bias current or a first bias voltage to the third terminal of the upper-stage transistor;
    a second bias circuit configured to supply a second bias current or a second bias voltage to the third terminal of the lower-stage transistor; and
    an adjustment circuit configured to adjust an impedance seen from the third terminal of the upper-stage transistor, wherein:
    the first bias circuit is different than the second bias circuit,
    the adjustment circuit comprises the ground path,
    the ground path comprises a second capacitor and at least one resistance element, the second capacitor and the at least one resistance element being connected in series between the third terminal of the upper-stage transistor and ground,
    the first bias current or the first bias voltage is supplied from the first bias circuit via a bias supply path to a supply node, and
    the adjustment circuit further comprises an inductor connected in the bias supply path between the first bias circuit and the supply node.

2. The power amplifier circuit according to claim 1, wherein the adjustment circuit further comprises a first resistance element connected in the bias supply path between the first bias circuit and the supply node.

3. A power amplifier circuit comprising:
    a lower-stage transistor having a first terminal, a second terminal, and a third terminal, wherein a first power supply voltage is supplied to the first terminal, the second terminal is connected to ground, and a first signal is supplied to the third terminal;
    a first capacitor;
    an upper-stage transistor having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the first capacitor, and the third terminal is connected to ground via a ground path;
    an inductor that connects the second terminal of the upper-stage transistor to ground; and
    an adjustment circuit configured to adjust an impedance seen from the third terminal of the upper-stage transistor, wherein:
    the adjustment circuit comprises the ground path,
    the ground path comprises a second capacitor and at least one resistance element, the second capacitor and the at least one resistance element being connected in series between the third terminal of the upper-stage transistor and ground,
    a first bias current or a first bias voltage is supplied from a first bias circuit via a bias supply path to a supply node,
    the adjustment circuit further comprises a first resistance element connected in the bias supply path between the first bias circuit and the supply node, and
    the at least one resistance element comprises:
        a second resistance element connected between the third terminal of the upper-stage transistor and the supply node, and
        a third resistance element connected between the supply node and ground.

4. The power amplifier circuit according to claim 2, wherein the adjustment circuit further comprises a third capacitor connected in parallel with the first resistance element.

5. The power amplifier circuit according to claim 3, wherein the adjustment circuit further comprises a third capacitor connected in parallel with the first resistance element.

6. The power amplifier circuit according to claim 1, wherein the first bias current or the first bias voltage has different characteristics than the second bias current or the second bias voltage.

7. The power amplifier circuit according to claim 6, wherein the first bias circuit and the second bias circuit have different configurations.

8. A power amplifier circuit comprising:
    a lower-stage transistor having a first terminal, a second terminal, and a third terminal, wherein a first power supply voltage is supplied to the first terminal, the second terminal is connected to ground, and a first signal is supplied to the third terminal;
    a first capacitor;

an upper-stage transistor having a first terminal, a second terminal, and a third terminal, wherein a second power supply voltage is supplied to the first terminal, a second signal obtained by amplifying the first signal is output from the first terminal, the second terminal is connected to the first terminal of the lower-stage transistor via the first capacitor, and a bias current or a bias voltage is supplied to the third terminal from a bias circuit via a bias supply path;

an inductor that connects the second terminal of the upper-stage transistor to ground; and an adjustment circuit configured to adjust an impedance seen from the third terminal of the upper-stage transistor, wherein:

the adjustment circuit comprises the bias supply path, the bias supply path comprises a third capacitor and a first resistance element, a first end of the third capacitor and a first end of the first resistance element each being connected to an output of the bias circuit, and a second end of the third capacitor and a second end of the first resistance element each being connected to the third terminal of the upper-stage transistor, and the third capacitor and the first resistance element are connected in parallel with each other.

9. The power amplifier circuit according to claim 8, the bias supply path further comprising:

a second resistance element connected between the third terminal of the upper-stage transistor, and the third capacitor and first resistance element, wherein the second resistance element is connected in series with the third capacitor and the first resistance element, and wherein the third capacitor and the first resistance element are connected in parallel with each other.

10. The power amplifier circuit according to claim 8, the bias supply path further comprising:

a second resistance element connected between the third terminal of the upper-stage transistor, and the third capacitor and first resistance element.

* * * * *